(12) United States Patent
Garside et al.

(10) Patent No.: US 10,139,138 B2
(45) Date of Patent: Nov. 27, 2018

(54) APPARATUS FOR REDUCING NOISE IN A CRYOCOOLER SUCH AS FOR MAGNETIC RESONANCE IMAGING SYSTEMS

(71) Applicant: Oxford Instruments Nanotechnology Tools Limited, Abingdon Oxon (GB)

(72) Inventors: John Garside, Whitney (GB);
Matthias Buehler, Poecking (DE);
Dieter Jedamzik, London (GB)

(73) Assignee: OXFORD INSTRUMENTS NANOTECHNOLOGY TOOLS LIMITED (GB)

( * ) Notice: Subject to any disclaimer, the term of this patent is extended or adjusted under 35 U.S.C. 154(b) by 998 days.

(21) Appl. No.: 14/401,992

(22) PCT Filed: Apr. 29, 2013

(86) PCT No.: PCT/GB2013/051092
§ 371 (c)(1),
(2) Date: Nov. 18, 2014

(87) PCT Pub. No.: WO2013/171455
PCT Pub. Date: Nov. 21, 2013

(65) Prior Publication Data
US 2015/0084633 A1    Mar. 26, 2015

(30) Foreign Application Priority Data
May 18, 2012  (GB) .................... 1208838.1

(51) Int. Cl.
*F25B 9/14* (2006.01)
*F25D 19/00* (2006.01)
(Continued)

(52) U.S. Cl.
CPC ............... *F25B 9/14* (2013.01); *F25B 9/145* (2013.01); *F25D 19/006* (2013.01);
(Continued)

(58) Field of Classification Search
CPC ........ F25B 9/14; F25B 9/145; G01R 33/3804; G01R 33/3815
See application file for complete search history.

(56) References Cited

U.S. PATENT DOCUMENTS

| 5,784,784 A * | 7/1998 | Flanigan ................... F01N 1/24 29/890.08 |
| 2009/0090579 A1 | 4/2009 | Nishida et al. |

FOREIGN PATENT DOCUMENTS

| GB | 2 391 926 | 2/2004 |
| GB | 2391926 A * | 2/2004 | ............. F25B 9/145 |
| GB | 2 422 655 | 8/2006 |

* cited by examiner

Primary Examiner — Brian King
(74) Attorney, Agent, or Firm — Blank Rome LLP

(57) ABSTRACT

An assembly for operating a cryocooler pedestal is provided. The assembly is operable when in use to provide a cryocooler pedestal with cyclical gaseous connection to high pressure and low pressure gas supply lines, and has a return conduit through which gas is caused to flow from the cryocooler pedestal into the low pressure supply line. The assembly further comprises a dispersion chamber adjacent the return conduit and in flow communication therewith through a plurality of orifices so as to reduce acoustic noise. The assembly has particular application in cooling a Magnetic Resonance Imaging system.

21 Claims, 5 Drawing Sheets

(51) Int. Cl.
  *G01R 33/38* (2006.01)
  *G01R 33/3815* (2006.01)
(52) U.S. Cl.
  CPC ..... *G01R 33/3804* (2013.01); *G01R 33/3815* (2013.01); *F25B 2500/12* (2013.01)

APPARATUS FOR REDUCING NOISE IN A CRYOCOOLER SUCH AS FOR MAGNETIC RESONANCE IMAGING SYSTEMS

RELATED APPLICATIONS

This is a national phase of PCT/GB2013/051092, filed Apr. 29, 2013, which claims priority to Great Britain Application No. 1208838.1, filed May 18, 2012. The entire contents of those applications are hereby incorporated by reference.

FIELD OF THE INVENTION

The present invention relates to apparatus for the reduction of noise in cryocoolers, and in particular to the reduction of noise in pulse tube refrigerators. The invention finds particular advantage when embodied in the cooling system of a Magnetic Resonance Imaging (MRI) system.

BACKGROUND TO THE INVENTION

Low temperature properties such as superconductivity are now widely used in a range of different applications including Magnetic Resonance Imaging (MRI), superconducting magnets, sensors and in fundamental research. Historically, the evaporation of cryogenic liquids such as nitrogen or helium has been used as a cooling mechanism in order to reach the low temperatures required for such applications. Cryogenic liquids, particularly helium, have associated disadvantages in that they are often "consumable" due to incomplete recovery of boiled off gas. Furthermore, such apparatus for storing or otherwise handling cryogenic liquids is often bulky and requires special handling procedures. Such apparatus and procedures are somewhat incompatible with patient care environments.

More recently, closed cycle refrigerators (CCR) have been used to replace cryogenic liquids in providing an alternative refrigeration mechanism. In contrast with the evaporation of cryogenic liquids, CCRs do not rely upon a phase change within the coolant. Instead, CCRs operate upon a principle of using the cooling which is associated with the work of compression and expansion of a working gas coolant. The term "mechanical refrigerators" is used herein to describe such apparatus although those of ordinary skill in the art will appreciate that the term "cryocooler" is synonymous with this term. This invention is directed primarily to pulse tube refrigerators (PTRs), although it can also be used in connection with other mechanical refrigerators such as Stirling cryocoolers and Gifford-McMahon coolers, amongst others.

PTRs use a working gas such as helium to provide cooling at relatively modest cooling powers, to temperatures below 4 Kelvin. These low temperatures are produced by expanding and compressing the working gas in a thermodynamic cycle. In order to run the cycle, a typical PTR system comprises three major components—a compressor, a valve assembly and a pedestal part. The compressor supplies the cryocooler with high pressure compressed gas such as helium via a high pressure line, and receives gas back from the cryocooler in a low pressure line. The pedestal part comprises pulse tube(s), heat exchanger(s) where the cooling power is supplied, and different regenerator materials for heat exchange with the incoming and outgoing gas.

The valve assembly connects the high and low pressure sides of the compressor to the pulse tubes and regenerators within the pedestal part, and controls the timing and distribution of gas flows between the compressor and pedestal part in order to effect the thermodynamic cycle and subsequent cooling.

PTRs are extremely advantageous since they are closed systems with few moving parts and are essentially lossless with regard to the working gas. For these reasons, they are attractive both technologically and commercially, and the use of PTR systems is of particular interest for cooling apparatus for medical applications such as MRI systems. Accordingly, there is an ongoing desire to improve the performance of such PTRs, especially in relation to acoustic noise. When in use, PTRs generate a "chirping" noise which not only is a nuisance for operators of the equipment, but this noise can also translate into vibration, impacting sensitive measuring equipment and thus adversely affecting experimental results. This is a particular problem when PTRs are used for MRI imaging applications where, in addition to improving image resolution, there is a desire to reduce vibrations and audible noise since it is well established that many medical MRI procedures are aborted by patients when they become distressed during such procedures.

This problem has been addressed in GB-A-2391926, where the noise has been attributed to gas flowing at high speed over corrugations in the low pressure line between the valve assembly and the compressor. In order to reduce noise, the system of GB-A-2391926 comprises a dead end volume in fluid communication with the low pressure line, such that gas in the low pressure line is diverted into said dead end volume, therefore reducing the average gas velocity over the corrugations in the low pressure line. In a different embodiment, the diameter of the low pressure line is increased. However, the use of a bulky dead end volume close to the PTR is not desirable, and there is a continued desire to reduce the noise associated with a PTR.

SUMMARY OF THE INVENTION

In accordance with a first aspect of the present invention, there is provided an assembly for operating a cryocooler pedestal, the assembly being operable when in use to provide a cryocooler pedestal with cyclical gaseous connection to high pressure and low pressure gas supply lines, the assembly having a return conduit through which gas is caused to flow from the cryocooler pedestal into the low pressure supply line and wherein the assembly further comprises a dispersion chamber adjacent the return conduit and in flow communication therewith through a plurality of orifices so as to reduce acoustic noise.

The cryocooler is typically a pulse tube refrigerator (PTR), and as is well known in the art, the "pedestal" part of a cryocooler comprises the one or more cooled stages and associated pulse tube(s) and regenerator(s). However, the present invention may also be implemented for any mechanical refrigerator such as a Stirling cryocooler of Gifford-McMahon cooler.

When the gas (which is typically helium but may be any suitable coolant gas such as nitrogen) is caused to flow from the cryocooler pedestal into the low pressure supply line via the return conduit, the sudden release of pressurised gas from the pedestal travelling through a narrow path results in pressure shock waves followed by turbulence-induced acoustic waves travelling in the gas. In the present context, "conduit" refers to a volume through which the coolant gas flows into the low pressure supply line. Such a volume may be, for instance, a chamber, a tube or a complex manifold assembly among other examples. The acoustic waves travelling in the gas couple to the outside atmosphere through the thin walls of the low pressure supply line. Further, as the inner walls of the low pressure supply line are typically corrugated, this enhances the coupling to the outside atmosphere, increasing the amount of acoustic noise. As the gas flow in a cryocooler is typically pulsed, this creates a "chirping" noise which is not only a nuisance for the operators of the cryocooler, but may also translate into vibration, thus impacting sensitive measuring equipment.

As we have discovered that the majority of the acoustic waves are generated before the coolant gas flows into the (typically corrugated) low pressure supply line, it is possible to reduce the noise by attenuating the high frequency noise components from the initial shock wave and turbulence before they reach the low pressure supply line. This is done by providing a dispersion chamber adjacent the return conduit and in flow communication therewith through a plurality of orifices such that the pressure wave and high frequency turbulence-induced acoustic disturbances enter the dispersion chamber, breaking up the wave fronts and trapping acoustic energy. This process significantly reduces the acoustic noise emanating from the cryocooler, which advantageously provides a more pleasant working environment for operators of the cryocooler, as well as reducing vibrations due to acoustic noise which may adversely affect experimental results.

As the dispersion chamber is adjacent the return conduit, it does not impede the flow of coolant gas from the cryocooler to the low pressure line. This advantageously means that the inclusion of the dispersion chamber does not reduce the cryogenic performance of the cryocooler. The assembly may comprise two or more dispersion chambers, two or more return conduits and/or two or more low pressure supply lines.

As a further advantage of the present invention, when the coolant gas flows from the cryocooler pedestal to the low pressure supply line, there is a sharp gradient of change from low to high pressure in the low pressure supply line which results in the flexible low pressure supply line trying to straighten, with the instantaneous force on the walls of the line being proportional to the gradient of the pressure change in the line. The highest pressure gradient is on the leading edge of the gas pulse into the low pressure supply line and this therefore translates into a brief spike in the straightening force on the low pressure supply line. This results in a brief mechanical displacement force on the cryocooler immediately following the flow of gas from the cryocooler pedestal. The spike when translated to frequency space corresponds to a fundamental frequency at the cyclical gaseous connection frequency, and also to a range of harmonic frequencies which can easily couple into equipment resulting in induced vibration. Advantageously, the relatively unrestricted expansion of the leading edge of the gas pulse through the orifices into the dispersion chamber reduces the gradient of the leading edge of the pressure pulse, corresponding to a reduction in the spike in the straightening force on the low pressure supply line. This has the advantage of reducing the instantaneous mechanical displacement force on the cryocooler which in turn reduces the impact on sensitive equipment.

The dispersion chamber is typically designed to influence only the gradient of the leading edge of the pressure pulse rather than the average pressure or gas flow rate, and therefore its volume can be kept very small. This is desirable and particularly advantageous over the bulky dead end volume seen in GB-A-2391926, for example.

The geometry of the return conduit, dispersion chamber and the plurality of orifices may be arranged appropriately so as to reduce acoustic noise.

The return conduit may be located either in a valve head or external to a valve head. Here, the valve head is a part of the assembly and comprises the means for providing the pedestal with the cyclical gaseous connection. This means is typically a rotary valve or individually controlled valves, such as needle valves or solenoid valves.

The return conduit may be located external to the valve head and be elongate, wherein the said plurality of orifices are provided in a wall of the return conduit. In such a case, the dispersion chamber is preferably positioned so as to surround the return conduit. Typically the dispersion chamber is coaxial with the return conduit, although alternatively it may be offset from the axis of the return conduit. Different geometries of the dispersion chamber are envisaged, such as a cylinder or a diamond shaped cross section. In one example, a plurality of dispersion chambers are provided by a plurality of sheets of material surrounding the return conduit, with perforations in said sheets of material providing the orifices. The dispersion chamber and the return conduit may be a unitary member, or alternatively the dispersion chamber may be spreadable from the return conduit.

Typically, the return conduit has a first opening releasably connectable to the low pressure supply line. This allows the assembly to be easily removed from the low pressure supply line and subsequently re-installed, which is particularly advantageous for maintenance purposes, for example. However, alternatively, the return conduit may be integrally moulded to the low pressure supply line. Further, the return conduit may have a second opening releasably connectable to the valve head, although similarly to above, the return conduit may alternatively be integrally moulded or formed with the valve head. Preferably, the return conduit is located between and releasably connectable to both the valve head and the low pressure supply line. In such a case, the return conduit can advantageously be retro-fitted to existing apparatus and is particularly easy to install.

The return conduit may have a larger cross sectional area than that of the low pressure supply line to provide additional expansion capacity for the pressure pulses in the return conduit. Further, the return conduit may comprise a first opening and a second opening, and wherein the axes defining the first and second openings are offset from each other, such that they do not align. This means that there is no direct line of sight between the two ends, advantageously reducing the amount of acoustic coupling into the outside atmosphere.

The assembly may further comprise acoustically insulating lagging on an outer side of the return conduit to further reduce acoustic noise. The lagging absorbs acoustic energy emanating from the return conduit, further reducing the acoustic noise emanating from the cryocooler. The acoustically insulating lagging may also be positioned on the low pressure supply line, particularly around the initial section of the low pressure line adjacent the assembly where the acoustic energy predominantly couples with the corrugated wall of the lines. Alternatively, the return conduit may further comprise acoustically insulating lagging on its inner side, and may comprise such lagging on both its inner and outer surfaces.

Alternatively, each of the return conduit and the dispersion chamber may be provided within the valve head. Each of the return conduit and dispersion chamber being provided within the valve head advantageously minimises the overall size of the cryocooler, which is important when it may be used in an application with spatial restriction, such as in an MRI scanner. This allows for a more compact cryocooler that is easier to install.

The return conduit may comprise a return chamber within the valve head through which the gas flows from the cryocooler to the low pressure gas line. In such an instance, the low pressure supply line is able to be connected directly to the assembly housing, advantageously minimising the size of the cryocooler.

Typically, the valve head contains a rotatable member for periodically connecting a tube of the cryocooler pedestal with the return chamber. The tubes of the cryocooler pedestal typically include at least one regenerator and at least one pulse tube. The rotatable member is typically driven by a motor provided within the dispersion chamber. A rotary valve is one example of such a member. The rotatable member may comprise at least one port in its running face that periodically aligns and cooperates with a tube of the cryocooler, thereby forming a path for the gas to flow from the cryocooler to the return chamber. Alternative means of periodically connecting a tube of the cryocooler with the return chamber may be used, such as solenoid valves.

The rotatable member may be supported by a plurality of bearings positioned in a wall between the return chamber and the dispersion chamber. Typically the bearings are ball bearings positioned in races, although other bearings may be used such as fluid bearings or magnetic bearings. The plurality of bearings may provide the plurality of orifices to effect the flow communication between the return chamber and the dispersion chamber. Specifically, the gas is able to flow through the gaps between the individual bearings.

The plurality of bearings may be sealed, in which case the plurality of orifices is provided in the wall between the return chamber and the dispersion chamber. Sealing the bearings advantageously means that they are not damaged by gas flow through the gaps between them. For example, with unsealed ball bearings, the flow of gas through the gaps has a tendency to force grease out from between the bearings.

The rotatable member may comprise one or more gas flow conduits having one or more corresponding first openings into the return chamber, and the low pressure supply line may comprise a tube having a second opening into the return chamber, wherein the said one or more first openings and the second opening are displaced relatively such that they do not come into alignment during use. In particular, they do not come into alignment during the period of initial gas flow through the one or more gas flow conduits. Advantageously, this means that the acoustic waves and pressure pulses created by the sudden release of gas from the cryocooler pedestal into the return chamber do not couple directly into the low pressure supply line, and instead partially couple through the plurality of orifices into the dispersion chamber. This offset between the first and second openings therefore means that more acoustic energy is trapped in the dispersion chamber, thus reducing the acoustic noise emanating from the cryocooler.

Similarly to the case described above where the return conduit is located external to the valve head, the return chamber may comprise acoustically insulating lagging on either or both of its inner and outer surfaces.

The assembly in accordance with the first aspect of the invention finds particularly advantageous application and use in the field of magnetic resonance and, in particular, magnetic resonance imaging. The reduction of acoustic noise and vibrations not only improves image quality, but also provides a more pleasant environment for a patient (in a medical environment) as the "chirping" sound during use is significantly reduced.

In accordance with a second aspect of the invention, there is provided an acoustic noise reduction system comprising a first assembly where the return conduit is located external to the valve head, as described above, and a second assembly where the return conduit is located within the valve head. This beneficially provides further acoustic noise suppression. Preferably, the first assembly and the second assembly are provided within a unitary housing.

Similarly to the first aspect of the invention, the second aspect finds particularly advantageous application in the field of magnetic resonance and, in particular, magnetic resonance imaging.

In accordance with a third aspect of the invention there is provided a magnetic resonance system comprising: a magnet system comprising a number of magnets for generating a magnetic field which is suitable for obtaining magnetic resonance signals from a target region; a radio frequency system for obtaining radio frequency signals from the target region; a control system for controlling the magnetic fields experienced within different parts of the target region in accordance with the magnet system and radio frequency system; a processing system for forming an image from the radio frequency signals; and, a cryogenic cooling system adapted in use to cool one or more of the magnet system or radio frequency systems using an assembly in accordance with the first aspect of the invention.

The magnet system typically includes superconductive magnets and wherein the cryogenic cooling system further comprises a heat transfer medium which is arranged to act as a heat sink for the superconductive magnets. Such a medium may take the form of a liquid coolant, a gaseous coolant or a solid high thermal conductivity material such as high purity copper. Typically, the assembly is used to operate a cryocooler operable to extract heat from the heat transfer medium when in use.

The present invention is applicable to both low frequency and high frequency cryocoolers. Low frequency coolers typically operate with gas cycles at 1-2 Hz, whereas high frequency cryocoolers operate at a higher frequency, such as 10 Hz or above.

BRIEF DESCRIPTION OF THE DRAWINGS

An example of an apparatus for reducing noise in a cryocooler according to the present invention is now described with reference to the accompanying drawings in which.

DETAILED DESCRIPTION OF THE DRAWINGS

Figure 1:
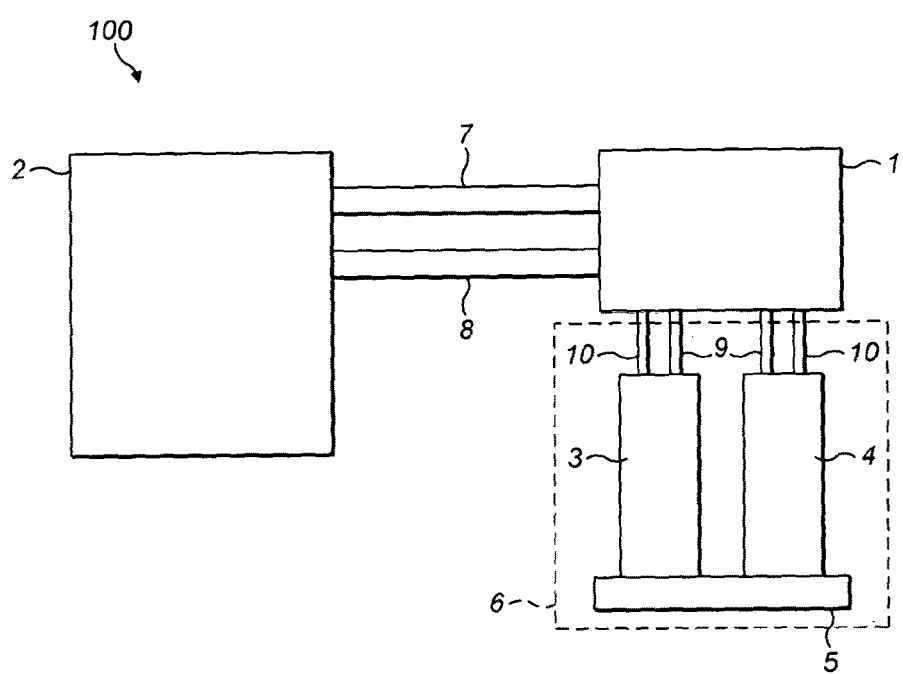
FIG. 1 is a schematic diagram showing a conventional pulse tube refrigerator (PTR)

FIG. 1 schematically shows a single stage pulse tube refrigerator (PTR) system 100. The PTR system comprises a scroll compressor 2 attached to a valve assembly 1 via a high pressure (HP) supply line 7 and a low pressure (LP) supply line 8. The HP and LP supply lines are flexible pipes capable of withstanding high pressure. In use, a suitable gaseous refrigerant such as helium is supplied from the scroll compressor 2 and fed via the HP supply line 7 to the valve assembly 1 at a high pressure of about 23-28 bar. The valve assembly 1 comprises a rotary valve 13 (see FIG. 2) which in use is driven by motor 25 via coupling 24. A bearing comprising inner race 18*a*, outer race 18*b* and ball bearings 18*c* supports the rotary valve within the valve assembly 1.

Although FIG. 1 illustrates a single stage PTR system 100 for the purposes of clarity, it will be appreciated that the present invention may be used on a two or more stage PTR system.

The rotary valve 13 comprises a number of ports on its running face 12 which, due to the rotation of the rotary valve 13, periodically cooperate with input 9 and output 10 pedestal tubes. The input pedestal tubes 9 transport helium gas from the compressor 2 into a regenerator 3 and a pulse tube 4, and the output pedestal tubes 10 transport the coolant gas back from the regenerator 3 and pulse tube 4 to the valve assembly 1. This flow and expansion and compression of helium gas within the pedestal part 6 provides cooling of the cold platform 5.

Figure 2:
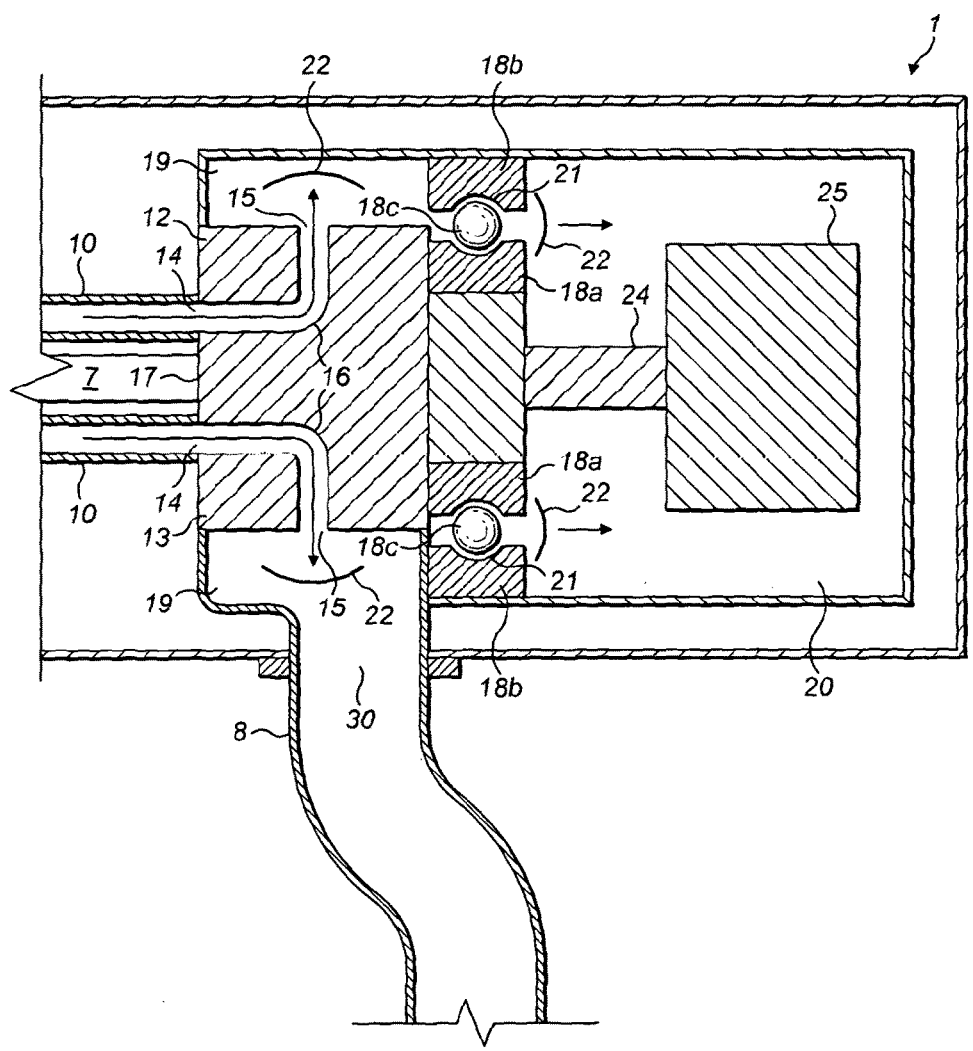
FIG. 2 shows a cross sectional view of a valve assembly in a PTR according to a first embodiment of the present invention.

FIG. 2 shows ports 14 on the running face 12 of the rotary valve 13, with the rotary valve positioned such that the ports 14 are aligned with and are in cooperation with the output pedestal tubes 10. A central port 17 in the running face allows gas from the HP supply line 7 to flow into the rotary valve 13 and be subsequently coupled to the pulse tube 4 and regenerator 3 through input pedestal tubes 9. The ports to cooperate with the input pedestal tubes 9 and the input pedestal tubes themselves are omitted from the figures for clarity purposes.

The schematic nature of the input 9 and output 10 pedestal tubes is to aid the clarity of the description. As the skilled person will appreciate, the input tubes 9 will be connected through different ports on the rotary valve 13 and at different times, in a similar manner to the output tubes 10. The predominant flow is to and from the regenerator 3 with phase control flow being applied to the flow of coolant into and out of the pulse tubes.

The rotary valve 13 is driven by motor 25 at a predetermined frequency such that the helium gas flow within the PTR system 100 provides the desired cooling power.

The race bearing defines a return chamber 19 and a dispersion chamber 20 within the valve assembly 1, as seen in FIG. 2. The bearing provides a plurality of orifices 21 between the return chamber 19 and dispersion chamber 20, as gas and pressure waves can pass between the chambers 19, 20 through the gaps between the individual ball bearings 18*c*.

When the ports 14 cooperate with the output pedestal tubes 10, the helium gas rapidly expands and accelerates from the pedestal part 6 through the ports 14, conduits 16 in the rotary valve 13, and exits into the return chamber 19 through exit ports 15. This flow of gas is seen by the arrows in FIG. 2. As well as the flow of gas, turbulence is generated along with pressure (acoustic) waves 22 generated by the sudden release of pressurised gas travelling though the narrow tubes.

As described above, the bearing provides a series of orifices 21 between the return chamber 19 and the dispersion chamber 20, such that the return chamber 19 and dispersion chamber 20 are in flow communication. This allows the leading edge of the pressure wave 22 and associated acoustic waves from that and the turbulent flow formed in the valve and return chamber 19 to couple into the dispersion chamber 20 through the orifices 21 and become trapped within the dispersion chamber 20 without impeding the flow of helium gas from the output pedestal tubes 10 to the LP supply line 8. Advantageously, the dispersion chamber 20 also provides an expansion region for the pressure wave 22, which allows the gradient of the leading edge of the pressure wave 22 to be softened before it enters the LP supply line 8. By trapping acoustic energy within the dispersion chamber 20, the present invention reduces the acoustic energy emanating from the LP supply line 8 caused by interaction of the pressure wave with the thin inner walls of the LP supply line 8. As well as reducing the distracting "chirping" sound, this also reduces the amount of acoustic frequency mechanical noise. Further, as explained above, the softening of the leading edge of the pressure waves reduces the amount of low frequency mechanical disturbance at the frequency of the rotary valve 13 (typically 1-2 Hz) and associated harmonics generated in the PTR system. These reductions of mechanical disturbance are particularly beneficial when using the PTR system for sensitive equipment, such as a physical properties measurement cryostat, high resolution MRI machine or a dilution refrigerator where any superfluous mechanical disturbance may influence the results.

Figure 3:
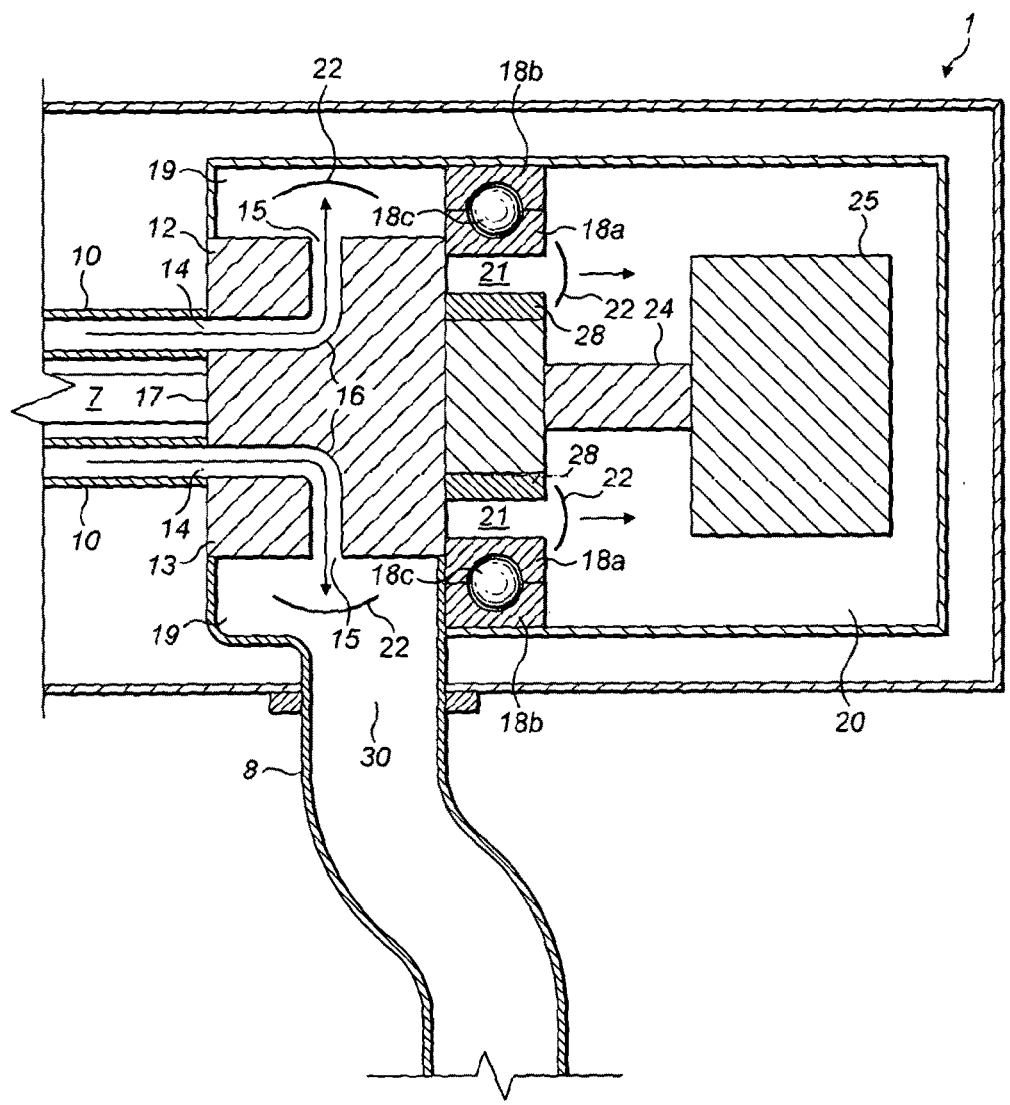
FIG. 3 shows a cross sectional view of a valve assembly in a PTR according to a second embodiment of the present invention.

FIG. 3 shows a cross sectional view of the valve assembly 1 similar to FIG. 2, and illustrates a second embodiment of the invention. Like reference numerals in FIGS. 2 and 3 depict like parts. In this embodiment the ball bearings 18*c* are sealed within bearing races 18*a*, 18*b* such that gas cannot flow between the bearings, and separate orifices 21 are provided between the return chamber 19 and the dispersion chamber 20. These orifices can be slots machined into the housing of the bearing races 18*a*, 18*b*, or holes drilled into the wall 28 between the return chamber 19 and the dispersion chamber 20.

FIG. 3 shows the orifices 21 positioned in the inner race 18*a* (i.e. at a smaller radial distance from the rotary valve 13 compared to the ball bearings 18*c*), although the orifices 21 may alternatively be positioned in the outer race 18*b* (i.e. at a larger radial distance from the rotary valve 13 compared to the ball bearings 18*c*). As the second embodiment of the present invention comprises sealed races 18*a*, 18*b* and dedicated orifices 21, this advantageously means that grease is not forced out of the bearing due to flow of gas past the ball bearings 18*c*, which can occur in the arrangement of the first embodiment. It will be appreciated that the bearing of the second embodiment does not have to be fully sealed. The fact that the valve assembly 1 of the second invention comprises dedicated orifices also means that the orifices 21 can be have a shape and size arranged to break up the acoustic waves and produce destructive interference of the pressure waves.

Figure 4:
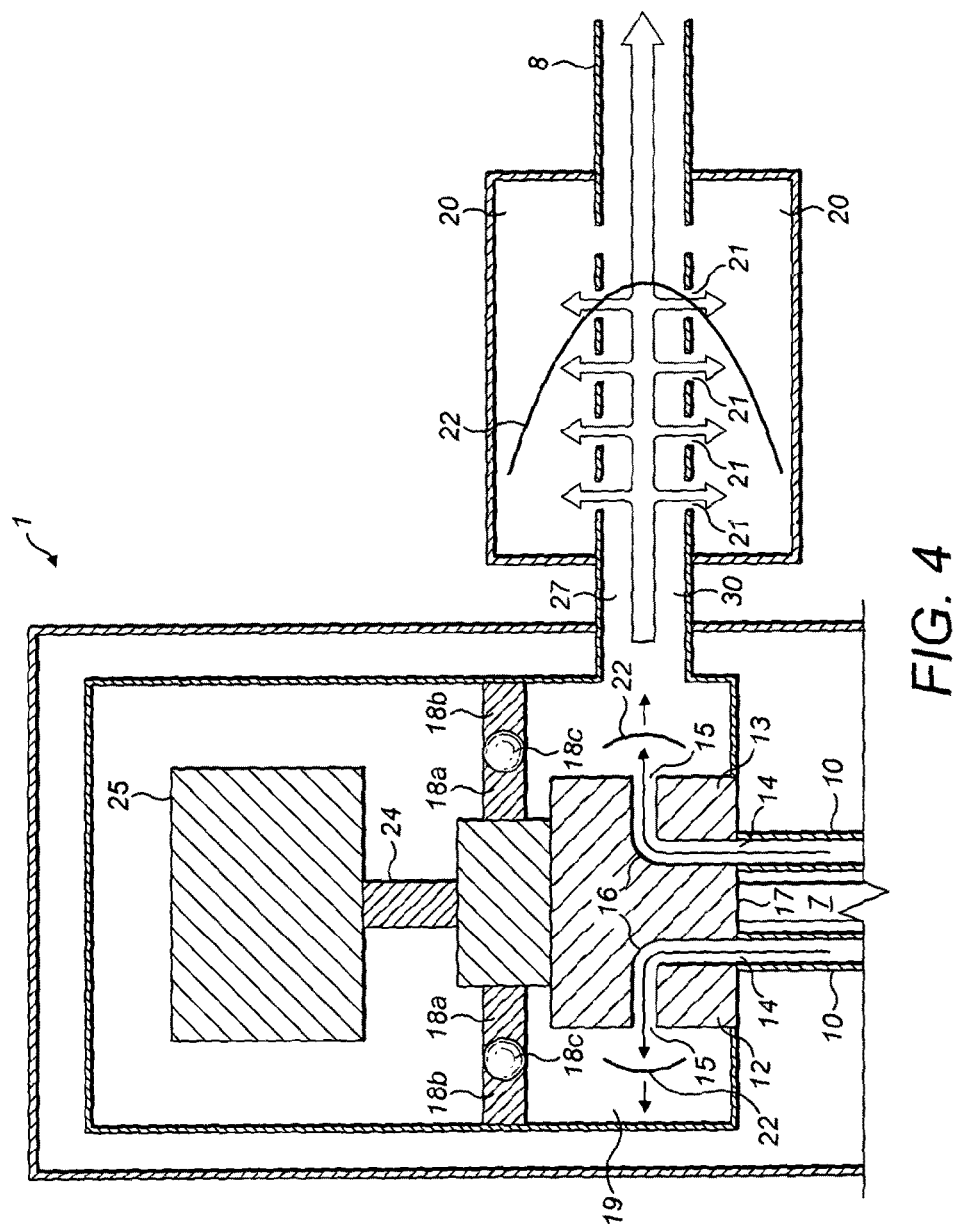
FIG. 4 shows a cross sectional view of a valve assembly in a PTR according to a third embodiment of the present invention; and, FIG. 5 is a schematic diagram of a magnetic resonance system incorporating a valve assembly in a PTR according to the examples.

FIG. 4 shows a cross sectional view of the valve assembly 1 according to a third embodiment of the present invention. Like reference numerals between the figures represent like parts. In the third embodiment, the rotary valve 13 is supported by a bearing with sealed races 18*a*, 18*b*, although non-sealed races may alternatively be used. Helium gas flows from the output pedestal tubes 10 into conduits 16 in the rotary valve 13 via ports 14, and exits into return chamber 19 through exit ports 15.

In the third embodiment, a return conduit 27 is located between the return chamber 19 and the LP supply line 8, as seen in FIG. 4. In the same manner as described hereinabove, a pressure wave 22 is formed due to the flow of gas from the output pedestal tubes 10 into the return chamber 19, and this pressure wave 22 and turbulence related acoustic noise couple into the return conduit. The return conduit 27 is separabley connected to the return chamber 19 and LP supply line 8, such that if required (for example for maintenance purposes), the return conduit 27 can be removed and the LP supply line connected directly to the return chamber 19.

A dispersion chamber 20 with a diameter greater than that of the return conduit 27 is arranged coaxially with the return conduit 27, said dispersion chamber 20 and return conduit 27 in communication via a plurality of orifices 21, as illustrated in FIG. 4. As the pressure wave 22 passes through the return conduit 27, it spreads through the plurality of orifices into the dispersion chamber 20 which is initially at a lower pressure than the return conduit 27. This breaks up the pressure wavefront 22 into smaller wavefronts which combine and disperse in the dispersion chamber 20, reducing the sharpness of the wavefront transmitted into the LP supply line 8. Acoustic energy from the pressure pulse and turbulence in the valve and conduit is also trapped within the dispersion chamber 20. This advantageously reduces acoustic noise and also reduces low frequency mechanical disturbance, as described above.

The dispersion chamber 20 in the fourth embodiment may be intrinsically moulded (for example machined, fabricated, cast or otherwise made) to the return conduit 27 so that the return conduit 27 and the dispersion chamber 20 are a unitary member; or alternatively the dispersion chamber 20 may be a separable from the return conduit 27 so that it can be removed and installed as required.

In FIGS. 2, 3 and 4, the opening 30 in the return chamber 19 leading to the LP supply line 8 is shown directly opposite an exit port 15 in the rotary valve 13. In one embodiment, the rotary valve 13 is arranged such that when the ports 14 cooperate with the output pedestal tubes 10, the exit ports 15 are offset from the exit opening 30, preferably by 90°. This ensures that the pressure wave 22 generated from the return flow of gas has more time to disperse and soften before entering the LP supply line 8. This advantageously reduces acoustic and low frequency mechanical noise.

In a further embodiment, acoustically insulating lagging (not shown) is applied to the return conduit 27 and/or the LP supply line 8 in order to further reduce the amount of acoustic noise emanating from the PTR system 100. Such acoustically insulating lagging can be applied to either or both of the inner and outer sides of the return conduit and/or LP supply line.

Any of the features of the above-described embodiments may be used in combination with any of the other embodiments. For example, the use of return conduit and coaxial dispersion chamber described hereinabove in the fourth embodiment may be used in combination with the chambers within the valve assembly 1 as described in the first and second embodiments.

It will be appreciated that the components shown in the figures are illustrated schematically and therefore other ordinary equipment which is not specifically shown, such as additional rotary valve ports and conduits, rotary valve biasing mechanisms, tuning valves, impedances, additional pulse tube and regenerator stages, safety valves, oil separators, filters, heat exchangers, sensors and so on, is nevertheless present.

Application to Magnetic Resonance Imaging Systems

Figure 5:
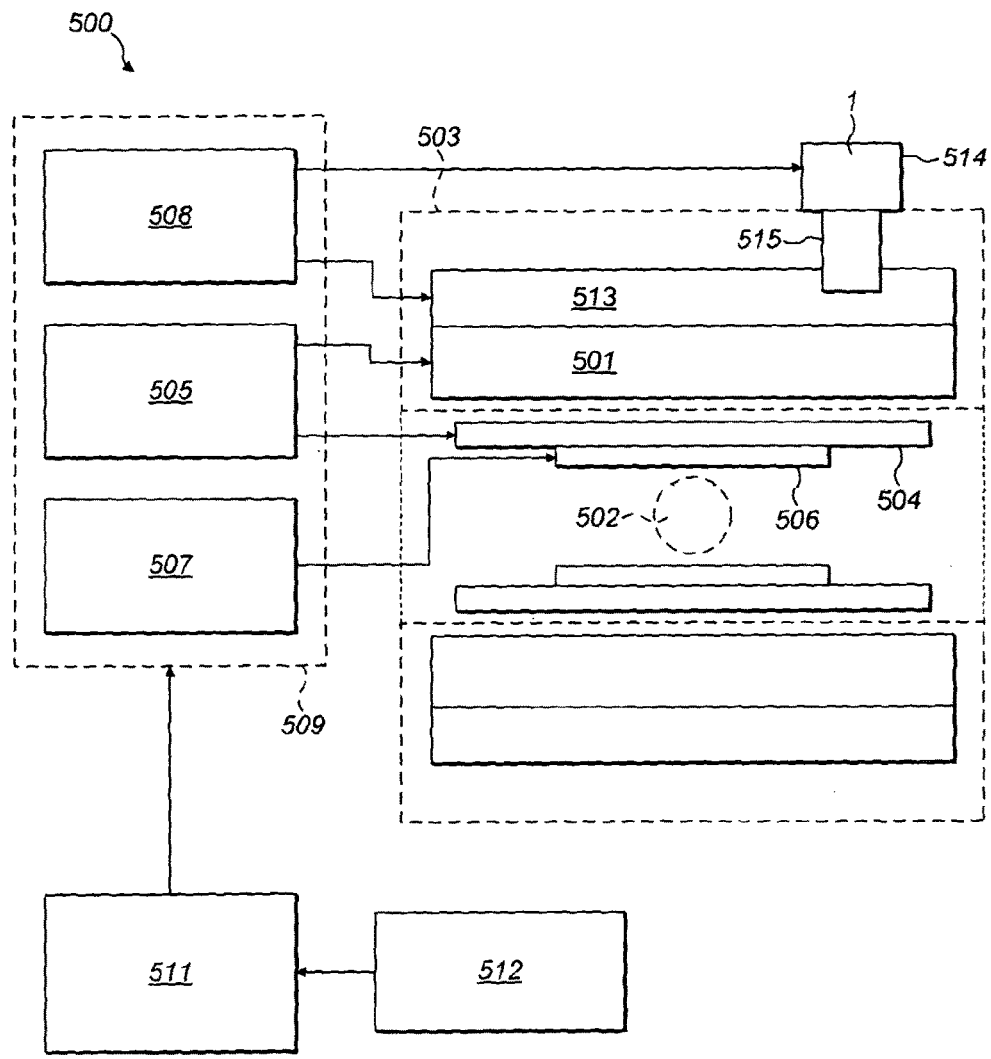

FIG. 5 illustrates an example application of a valve assembly in a PTR used for providing cooling power to a magnetic resonance imaging system. It will be understood that other cryocoolers may be used. The magnetic resonance imaging system 500 includes a primary magnet system 501. The primary magnet system 501 includes a main field magnet arranged in the form of superconducting coils wound on a former in a solenoid arrangement. It will be understood that other magnets are present within the system for ensuring magnetic field correction, including shimming magnets, to ensure that the magnetic field generated within a target region of interest 502 within the centre of the solenoid arrangement is sufficiently highly homogeneous in order to produce highly spatially resolved signals. In a medical environment, part of the body of a patient to be investigated is positioned within this target region 502. When in use, the superconducting coils are maintained below their superconducting transition temperature by placing them in thermal contact with a heat sink of some kind, and ensuring they are held in a cryostat 503 which provides a highly thermally insulated environment.

According to the principles of MRI, the spatial information from within the target region is obtained by analysing radio-frequency (RF) signals received from material within the target region when such a region is subjected to magnetic field gradients. The magnetic field gradients are generated by gradient field coils 504 under the control of a magnet controller 505 which controls the gradient field coils 504 and the primary magnetic field system 501. The gradient coils produce magnetic field gradients in three orthogonal directions using resistive magnets since the field strength required is much lower. It is advantageous to place the gradient field coils 504 close to the target region and therefore within the solenoid bore. Similarly, an RF transmitter/receiver 506, which transmits and receives radio frequency signals from the target region is advantageously placed close to the target region 502, again, as shown in FIG. 5, within the solenoid bore. The transmitter/receiver 506 is controlled using an RF controller 507. A cooling system controller 508 controls the cooling of each cooled component of the MRI system 500, such as the primary magnetic field system. The magnet controller 505, RF controller 507 and cooling system controller 508 are in turn each operated as part of a system controller 509.

As will be understood by those of ordinary skill in the art, the formation of meaningful imaging data from the RF signals received from the target region under the respective gradient conditions requires advanced and substantial computational resources. These are provided within the present example system by the image acquisition and processing system 511. The example system in practice will include other components and apparatus, for example including patient monitoring, safety monitoring, data storage and more. Each is not shown in FIG. 5 although will be understood to be present. The skilled operator of the MRI system controls the system through the user interface 512. As will be understood, the controllers and other apparatus described above are generally implemented using computer software and electronics.

We turn now to the cooling system itself which is shown at 513 in FIG. 5, this being under the operational control of the cooling system controller 508. As an example of an implementation of the cooling system 513, the magnetic field coils of the superconducting primary magnet system 501 are placed in contact with a heat sink by being surrounded by liquid cryogen such as helium-4. In a practical implementation of a high-temperature superconductor used for the primary magnet windings, then the coolant could be a different liquid such as nitrogen. In the present example the low temperature superconducting coils are immersed within a reservoir forming part of the cooling system 513. The liquid cryogen absorbs heat over time and this causes boil-off into a head space within an upper region of the cooling system 513. The cooling system 513 provides cooling power through the use of a PTR having a valve assembly 1 of the form discussed earlier, namely having a reduced mechanical disturbance and acoustic noise due to the use of a dispersion chamber in flow communication with the return conduit. The PTR is shown at 514. In this case a two stage PTR is used and the first (higher temperature) stage is connected to radiation shield provided within the cryostat. The second stage, shown at 515, is positioned within the interior of the reservoir within the head space mentioned above. Thus, the gaseous boiled-off helium is recondensed by the second stage of the PTR (since its operational temperature is below the condensation point of the liquid helium) and the liquid helium is returned to the reservoir to provide further cooling. In this manner the system may be used in a "lossless" state whereby effectively no helium is lost from the system during operation, since all helium which is boiled-off is ultimately recondensed by the PTR.

As cryocoolers, such as PTRs, improve over time in terms of their cooling power it is becoming possible to reduce the amount of cryogen needed to ensure reliable operation of superconducting magnets. For example rather than immerse the material in a bath of effectively static fluid it is conceivable to use an externally pumped circuit to provide flowing cryogen so as to cool the superconductor. This causes technical challenges in terms of engineering such a flow path which provides sufficient heat sinking of all parts of the magnet. Furthermore, whilst liquid coolant may be preferred, it is possible, particularly for high temperature superconductors, to consider gaseous cooling (since the superconducting transition temperature is above the boiling point of the liquid cryogen). A cooling system embodying such a pumped flow path, where part of the flow circuit is cooled using a cryocooler, is contemplated as an alternative example cooling system 513.

At the forefront of such developments is the desire to deliver the cooling power directly from a cryocooler to the magnet coils using conductive cooling through a solid high thermal conductivity material, rather than use cryogenic fluids. Some such designs have been proposed and in these cases it is particularly important to provide a close approach between the cooled stage of the cryocooler, such as PTR stage 515, and the superconducting material. In principle this may also be achieved using the cooling system 513. It may be necessary in practice to provide multiple instances of the cryocooler such as PTR 514 in the above examples, particularly in the conductive cooling case here.

In each of the above examples of providing cooling power to the superconducting material there is advantage in providing the PTR within a short distance from the material to be cooled. This reduces the volumes of coolant required, the additional sources of heat input and the overall cost. However, the operation of the PTR in the above example may cause small but significant movements in the magnetic field coils due to vibration. It will therefore be appreciated that by use of a valve assembly according to the present invention having improved vibration and noise performance, provides a significant advantage when implemented in an MRI system. Further, the reduced "chirping" noise provides an improved environment for an MRI patient.

Whilst the above discussion is focussed upon the cooling of the primary magnet system 501, it has been proposed that cryocoolers may be useful in the cooling of other parts of an MRI system. For example, it has been proposed that an RF transmitter/receiver system may be implemented using coils which are cooled. These may be implemented as superconducting coils in which case they require to be cooled below their superconducting transition temperature. PTR systems with improved valve assemblies discussed herein may also be used to advantage in the cooling of such coils (either resistive or superconducting), for example by cooling a flow path of circulating coolant which may be at cryogenic temperature.

The invention claimed is:

1. An assembly for operating a cryocooler pedestal, the assembly being operable when in use to provide a cryocooler pedestal with cyclical gaseous connection to high pressure and low pressure gas supply lines, the assembly having a return conduit through which gas is caused to flow from the cryocooler pedestal into the low pressure supply line, wherein the assembly further comprises a dispersion chamber adjacent the return conduit and in flow communication therewith through a plurality of orifices so as to reduce acoustic noise, and wherein each of the return conduit and the dispersion chamber is located within a valve head of the assembly.

2. An assembly according to claim 1, wherein the return conduit is elongate, and wherein the said plurality of orifices are provided in a wall of the return conduit.

3. An assembly according to claim 2, wherein the dispersion chamber is positioned so as to surround the return conduit.

4. An assembly according to claim 2, wherein the return conduit has a first opening releasably connectable to the low pressure supply line.

5. An assembly according to claim 2, wherein the return conduit has a second opening releasably connectable to the valve head.

6. An assembly according to claim 2, wherein the return conduit has a first opening and a second opening, and wherein the axes defining the first and second openings are offset from each other.

7. An assembly according to claim 2, further comprising acoustically insulating lagging on an outer side of the return conduit to further reduce acoustic noise.

8. An assembly according to claim 2, further comprising acoustically insulating lagging on an inner side of the return conduit to further reduce acoustic noise.

9. An assembly according to claim 1, wherein the return conduit comprises a return chamber within the valve head through which the gas flows from the cryocooler pedestal to the low pressure gas line.

10. An assembly according to claim 1, wherein the valve head contains a rotatable member for periodically connecting a tube of the cryocooler pedestal with the return chamber.

11. An assembly according to claim 10, wherein the rotatable member is supported by a plurality of bearings positioned in a wall between the return chamber and the dispersion chamber.

12. An assembly according to claim 11, wherein the plurality of bearings provides the plurality of orifices to effect the flow communication between the return and dispersion chambers.

13. An assembly according to claim 11, wherein the plurality of bearings are sealed and the orifices are provided in the wall between the return chamber and the dispersion chamber.

14. An assembly according to claim 10, wherein the rotatable member comprises one or more gas flow conduits having corresponding more or more first openings into the return chamber, wherein the low pressure supply line comprises a tube having a second opening into the return chamber, and wherein the said one or more first openings and the second opening are displaced relatively such that they do not come into alignment during use.

15. An assembly according to claim 10, wherein a motor for rotating the rotatable member is provided within the dispersion chamber.

16. An assembly according to claim 1, further comprising acoustically insulating lagging on an outer side of the return conduit to further reduce acoustic noise.

17. An acoustic noise reduction system comprising a first assembly according to claim 2 and a second assembly having a return conduit through which gas is caused to flow from the cryocooler pedestal into the low pressure supply line, and wherein the assembly further comprises a dispersion chamber adjacent the return conduit and in flow communication therewith through a plurality of orifices so as to reduce acoustic noise.

18. The acoustic noise reduction system of claim 17, wherein the first assembly and the second assembly are provided within a unitary housing.

19. Use of an assembly or acoustic noise reduction system according to claim 1 in providing cooling for a magnetic resonance system.

20. A magnetic resonance system comprising:
a magnet system comprising a number of magnets for generating a magnetic field which is suitable for obtaining magnetic resonance signals from a target region;
a radio frequency system for obtaining radio frequency signals from the target region;
a control system for controlling the magnetic fields experienced within different parts of the target region in accordance with the magnet system and radio frequency system;
a processing system for forming an image from the radio frequency signals; and,
a cryogenic cooling system adapted in use to cool one or more of the magnet system or radio frequency systems using an assembly in accordance with claim 1.

21. A magnetic resonance system according to claim 20, wherein the magnet system includes superconductive magnets, and wherein the cryogenic cooling system further comprises a heat transfer medium which is arranged to act as a heat sink for the superconductive magnets.

* * * * *